United States Patent [19]
Bergemont

[11] Patent Number: 5,371,030
[45] Date of Patent: * Dec. 6, 1994

[54] METHOD OF FABRICATING FIELD OXIDE ISOLATION FOR A CONTACTLESS FLASH EPROM CELL ARRAY

[75] Inventor: Albert M. Bergemont, San Jose, Calif.

[73] Assignee: National Semiconductor Corporation, Santa Clara, Calif.

[*] Notice: The portion of the term of this patent subsequent to Aug. 31, 2010 has been disclaimed.

[21] Appl. No.: 9,330

[22] Filed: Jan. 26, 1993

Related U.S. Application Data

[62] Division of Ser. No. 687,105, Apr. 18, 1991, abandoned.

[51] Int. Cl.$^5$ .............................. H01L 21/70
[52] U.S. Cl. ........................ 437/52; 437/43; 437/48
[58] Field of Search .................... 437/43, 48, 52

[56] References Cited

U.S. PATENT DOCUMENTS

| | | | |
|---|---|---|---|
| 5,081,056 | 1/1992 | Mazzali et al. | 437/43 |
| 5,100,819 | 3/1992 | Gill et al. | 437/43 |

FOREIGN PATENT DOCUMENTS

| | | | |
|---|---|---|---|
| 0152673 | 1/1989 | Japan | 437/43 |

Primary Examiner—Tom Thomas
Attorney, Agent, or Firm—Limbach & Limbach

[57] ABSTRACT

A method of forming a contactless EPROM cell inlcudes an initial step of forming an N+ source line in a silicon substrate. First and second N+ drain lines are then formed in parallel with and spaced-apart from the source line on opposite sides of the source line. First and second field oxide strips are formed in parallel with, but spaced-apart from the first and second drain lines, respectively, such that the source line/drain line structure is bounded on both sides by the first and second field oxide strips to separate the structure from adjacent source/drain line structures. First and second poly 1 lines overly the channel regions between the first drain line and the source line and the second drain line and the source line respectively, and are separated therefrom by a first layer of dielectric material. A plurality of spaced-apart, parallel poly 2 word lines overly and run perpendicular to the first and second poly 1 lines and are spaced-apart therefrom by a second dielectric material. Thus, the method results in an EPROM array having cells that are defined at each crossing of the poly 1 lines and the poly 2 word lines.

3 Claims, 6 Drawing Sheets

METHOD OF FABRICATING FIELD OXIDE ISOLATION FOR A CONTACTLESS FLASH EPROM CELL ARRAY

This is a divisional of application Ser. No. 687/105, filed Apr. 18, 1991.

BACKGROUND OF THE INVENTION

1. Field of the Invention

The present invention relates to electrically programmable read only memory (EPROM) devices and, in particular, to a contactless EPROM cell array structure which utilizes a field oxide bit line isolation scheme that eliminates the requirement for the complex virtual ground row decoders normally associated with flash EPROM arrays.

2. Discussion of the Prior Art

An electrically programmable read only memory (EPROM) device is a non-volatile memory integrated circuit which is used to store binary data. Power can be removed from an EPROM without loss of data. That is, upon reapplying power, the originally-stored binary data is retained.

In addition to its data retention capability, an EPROM can also be programmed to store new binary data. Reprogramming is accomplished by first exposing the EPROM to an ultra-violet (UV) light source in order to erase the old binary data. A UV-transparent lid on the packaged EPROM chip allows this erasure to occur. Following erasure, the new binary data is written into the EPROM by deactivating the chip select line in order to switch the EPROM's data outputs to inputs. The EPROM address inputs are then set to a starting value, the desired data is connected to the data inputs and the data is written into the data storage register identified by the address inputs. The address inputs are then incremented and the cycle is repeated for each data storage register in the EPROM array.

In an EPROM read operation, the binary data stored in the data storage register identified at the address inputs is connected to the chip's data output buffers. If the EPROM's chip select signal is activated, then the binary data from the selected storage register is provided to the databus.

An electrically erasable programmable read only memory (EEPROM) is a variation of the EPROM design wherein binary data is read, written and erased electrically. A single operation erases the selected data storage register. In the case of the so-called "flash" EPROM device, all data storage registers in the memory array ar electrically erased in a single operation.

The state of the art of flash EPROM cells is represented by the Intel ETOX cell, which is illustrated in FIGS. 1-3. FIG. 1 shows a portion of a typical T-shaped layout of an ETOX cell array with one drain contact 22a sharing two cells. FIG. 2 shows a cross-section of an ETOX cell which is taken along line A—A, i.e. along a polysilicon (poly 2) word line 16 in the portion of the ETOX array illustrated in FIG. 1. FIG. 3 shows a cross-section of an ETOX cell taken along line B—B, i.e. along a N+ bit line in the portion of the ETOX array illustrated in FIG. 1.

As shown in the FIG. 1 layout, and as stated above, the ETOX array is based on the standard "T-shaped" EPROM cell. As shown in FIGS. 2 and 3, it is implementated utilizing a very thin gate oxide 12 (about 100Å) and graded N+/N− implants in the source regions 14 to prevent disturbances due to band-to-band tunneling in the erase mode.

As shown in FIG. 4A, the ETOX flash cell 10 is written in the conventional EPROM manner. That is, hot electrons are injected from the source region 14 into the polysilicon (poly 1) floating gate 18 when the poly 2 word line 16 and the N+ bit line 20 are both high.

As shown in FIG. 4B, erasing the ETOX cell 10 is performed by tunneling electrons from the floating gate 18 through the thin oxide 12 close to the source region 14 when the source region 14 is high, the drain 20 is floating and the word line 16 is low.

SUMMARY OF THE INVENTION

A method of forming the above-described contactless EPROM cell array comprises the following steps. First, parallel, spaced-apart strips of field oxide are formed in the silicon substrate. Next, a layer of dielectric material is formed on the silicon substrate between the field oxide strips. A layer of first polysilicon (poly 1) is then formed over the layer of first dielectric material. A second layer of dielectric material is then formed over the poly 1 layer. Next, the sandwich structure comprising the poly 1 and overlying second dielectric material is masked and patterned to define first and second poly 1 lines that are spaced-apart from one another and from the adjacent field oxide strips and are separated from the substrate by the first dielectric material and have the second dielectric material formed thereon. Next, an N+ source region is formed in the substrate between the first and second poly 1 lines and, simultaneously, first and second N+ drain regions are formed in the substrate between the first poly 1 line and its adjacent field oxide strip and the second poly 1 line and its adjacent field oxide strip, respectively. Next, a differential oxide step is performed to grow additional dielectric material on the second dielectric material overlying the first and second poly 1 lines and, simultaneously to grow oxide material over the N+ source line and the first and second N+ drain lines. Next, a plurality of spaced-apart parallel-running poly 2 word lines are formed overlying and running perpendicular to the first and second poly 1 lines and spaced-apart therefrom by the second dielectric material and additional dielectric material. Finally, a stacked etch step is performed utilizing the poly 2 word lines to define the first and second poly 1 lines as the poly 1 floating gates of the EPROM cells of the array. Thus, the oxide formed over the N+ source lines and the first and second N+ drain lines during the differential oxide step protects the N+ source/drain lines during the stacked etch step from substrate "digging." The individual EPROM cells of the array are defined at the crossing of the poly 2 word lines with the underlying poly i floating gates.

A better understanding of the features and advantages of the present invention will be obtained by reference to the following Detailed Description of the Invention and accompanying drawings which set forth an illustrative embodiment in which the principles of the invention are utilized.

DETAILED DESCRIPTION OF THE INVENTION

Figure 5:
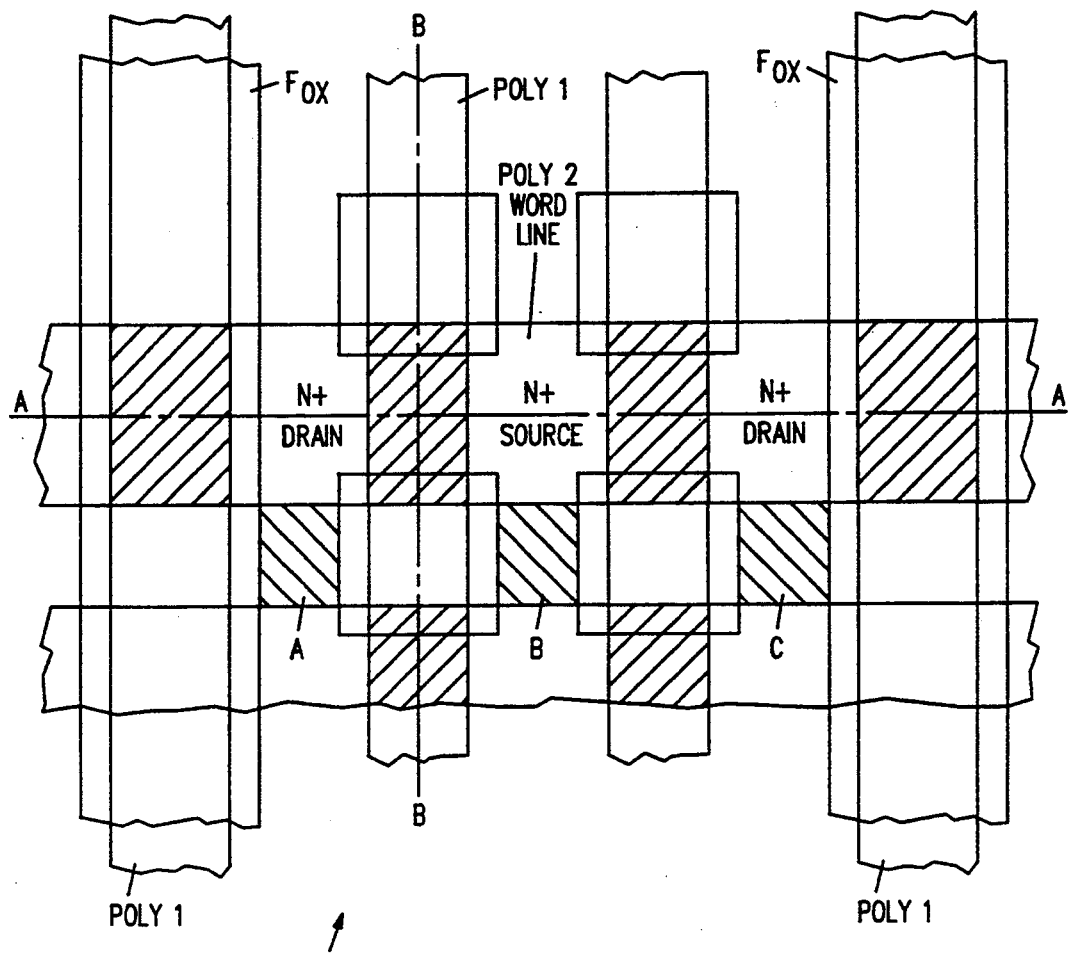
FIG. 5 is a layout illustrating a contactless flash EPROM cell using a standard row decoder in accordance with the present invention.
Figure 6:
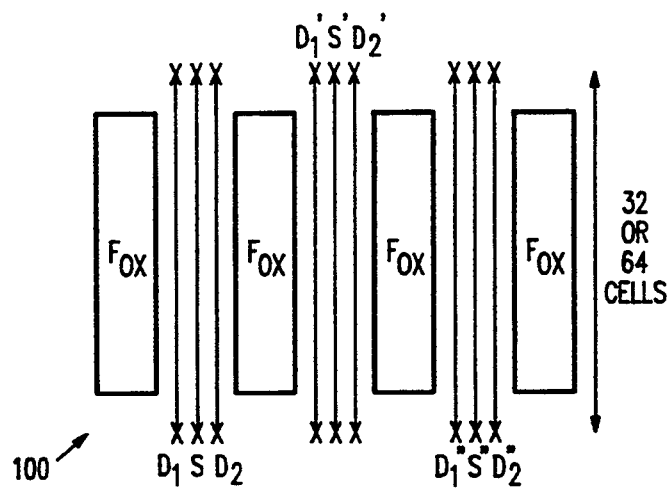
FIG. 6 is a layout of an EPROM array utilizing a contactless flash EPROM cell in accordance with the present invention.

FIGS. 5 and 6 illustrate the layout of a portion of a contactless flash EPROM cell array 100 in accordance with the present invention. As shown in FIG. 5, an EPROM cell within the array 100 does not share one contact with two cells, as is the case in conventional flash EPROM arrays. Rather, the flash EPROM array bit lines are contacted every 32, 48 or 64 cells (a so-called "contactless" array structure).

As shown in FIGS. 5 and 6, two adjacent cells within the array 100 share the same source line S and are separated from other cells in the array 100 along the same poly 2 word line (not shown in FIG. 6) by field oxide (Fox). That is, as best shown in FIG. 6, the separate drains $D_1$ and $D_2$ of adjacent cells share a common source. Each column of shared-source cells is separated from adjacent shared-source cells (e.g., $D_1'/D_2'$-$S'$ and $D_1''/D_2''$-$S''$ in FIG. 6) along the same word line by field oxide.

Thus, there is no need for a complex virtual ground row decoder which consumes large die area.

Figure 1:
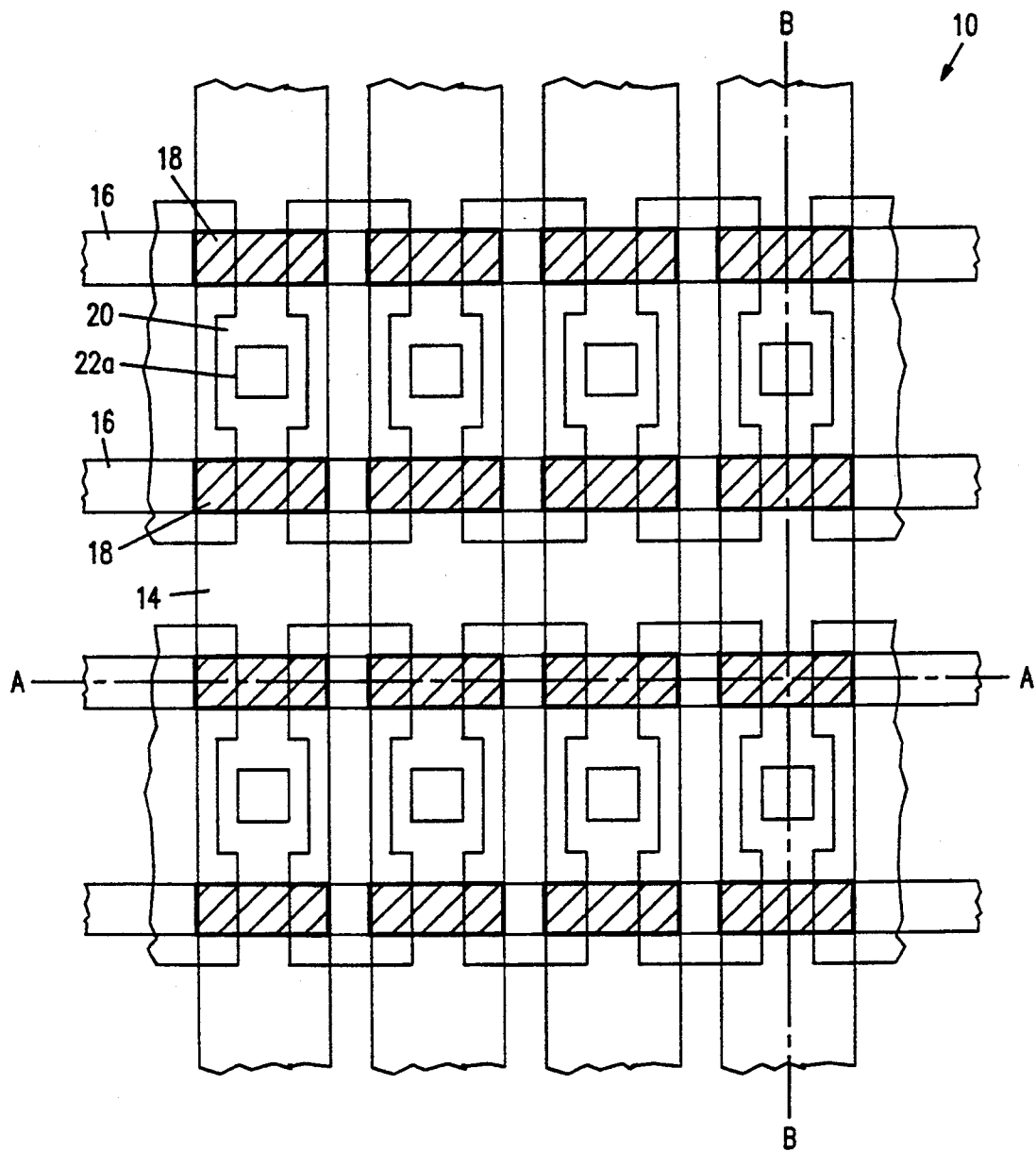
FIG. 1 is a layout drawing illustrating a conventional flash EPROM cell, the Intel ETOX cell, with one contact to the drain sharing two cells.
Figure 2:
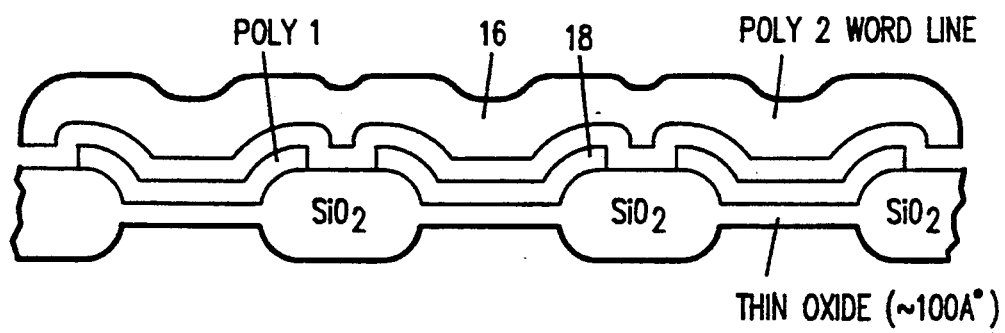
FIG. 2 is a cross-sectional view taken along line A—A in FIG. 1.
Figure 3:
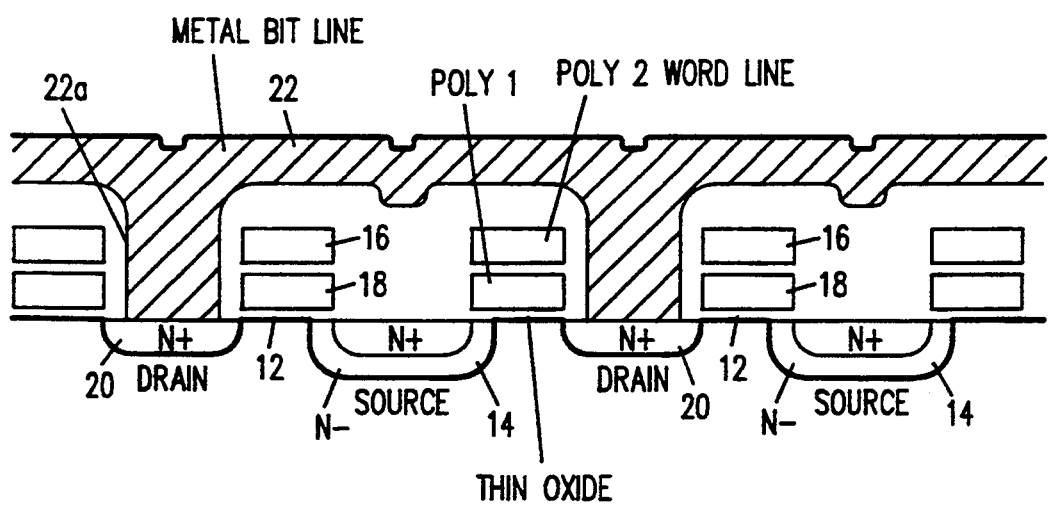
FIG. 3 is a cross-sectional view taken along line B—B in FIG. 1.
Figure 4A:
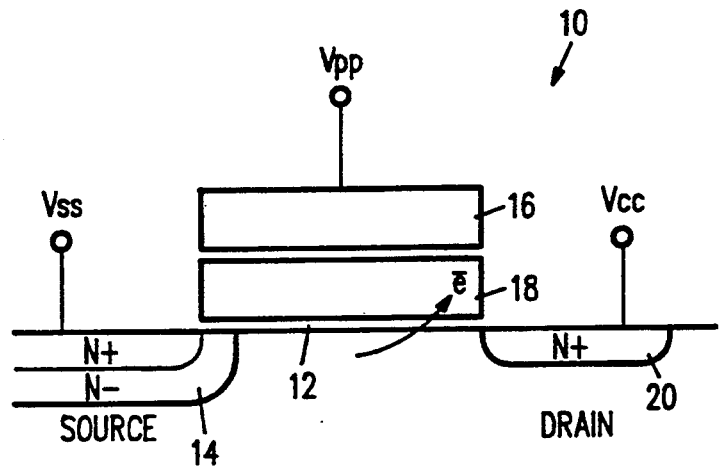
FIG. 4A is a cross-sectional view illustrating operational voltages for the write mode of the flash EPROM cell shown in FIGS. 1-3.
Figure 4B:
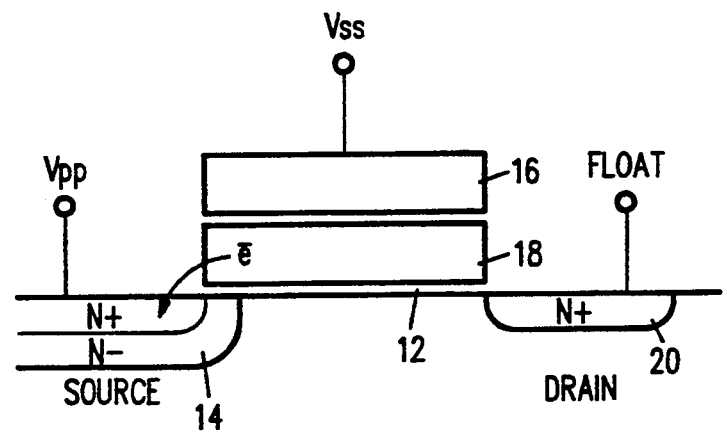
FIG. 4B is a cross-sectional view illustrating operational voltages for the erase mode of the flash EPROM cell shown in FIGS. 1-3.

The cell structure shown in FIGS. 5 and 6 uses the same write and erase mode operating voltages as the ETOX cell illustrated in FIGS. 4A and 4B. Similarly, the common source of the cell is twice implanted to provide a graded junction to sustain the erasing voltage, as shown in FIG. 7.

Figure 7:
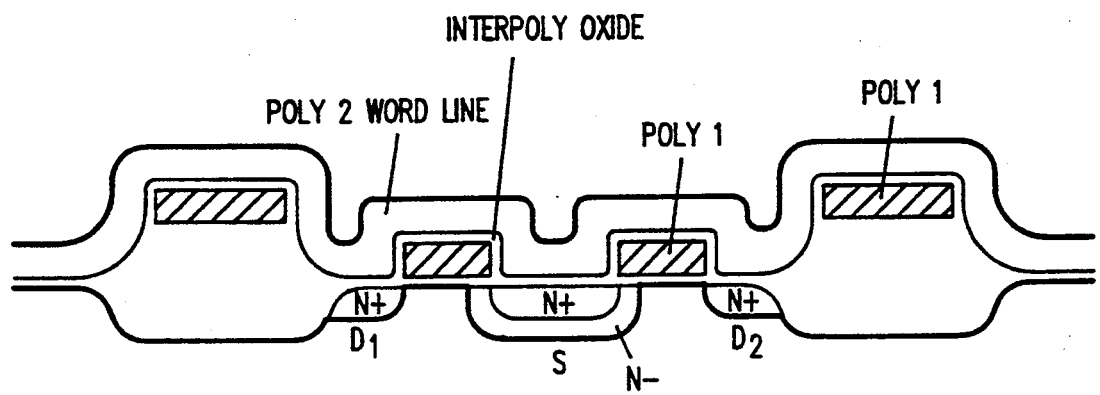
FIG. 7 is a cross-sectional view taken along line A—A in FIG. 5.
Figure 8:
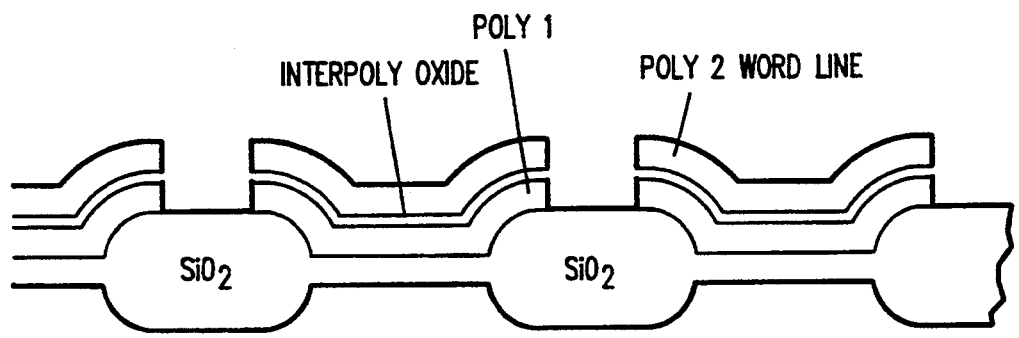
FIG. 8 is a cross-sectional view taken along line B—B in FIG. 5.

As further shown in FIG. 7, a layer of first polysilicon (poly 1) is maintained over the array field oxide separating two adjacent drain regions. This poly 1 layer reduces the voltage over the field oxide when the word line is at high potential through poly 1 to poly 2 capacitive coupling. This helps to reduce bit line loading by decreasing the dopant concentration under the field oxide.

Referring back to FIG. 5, in order to realize a stacked etch EPROM cell configuration utilizing the concepts of the present invention described above, the oxide over the buried N+ bit lines must be thick enough to avoid digging the substrate silicon in regions A, B and C when etching the remaining oxide-nitride-oxide (ONO)/poly 1 combination.

To avoid this digging, in accordance with the present invention, and as described below, a module for formation of a differential oxide over the N+ bit lines is provided in the process flow.

First, a first layer of polysilicon (poly 1) is deposited and doped in the conventional manner. Next, a layer of interpoly ONO is grown to a thickness of about 300Å. The first layer of polysilicon is then masked using photoresist and the ONO/poly 1 sandwich is etched. The photoresist mask is then stripped and the N+ bit lines are implanted, usually utilizing a conventional arsenic implant. Following formation of the N+ bit lines, a differential oxide is grown to a thickness of approximately 1000Å on the N+ bit lines and to a thickness of approximately 300Å on the poly 1. Next, a second layer of polysilicon (poly 2) is deposited and doped in the conventional manner. This poly 2 layer is then masked and etched. The ONO is then etched, resulting in the thickness of the oxide over the buried N+ bit line dropping to about 700Å. Next, the poly 1 is etched in a stacked etch step that utilizes the poly 2 word line to give final definition to the poly 1 floating gates. Since the selectivity between poly and silicon dioxide is high during the poly 1 etch, no etching of silicon is possible over regions A, B and C in FIG. 9, which regions are defined between the poly 1 lines and the poly 2 lines.

Thus, the contactless flash EPROM cell of the present invention may be arranged in an EPROM array which provides for higher packing density than the conventional T-shaped flash EPROM cell.

Figure 9:
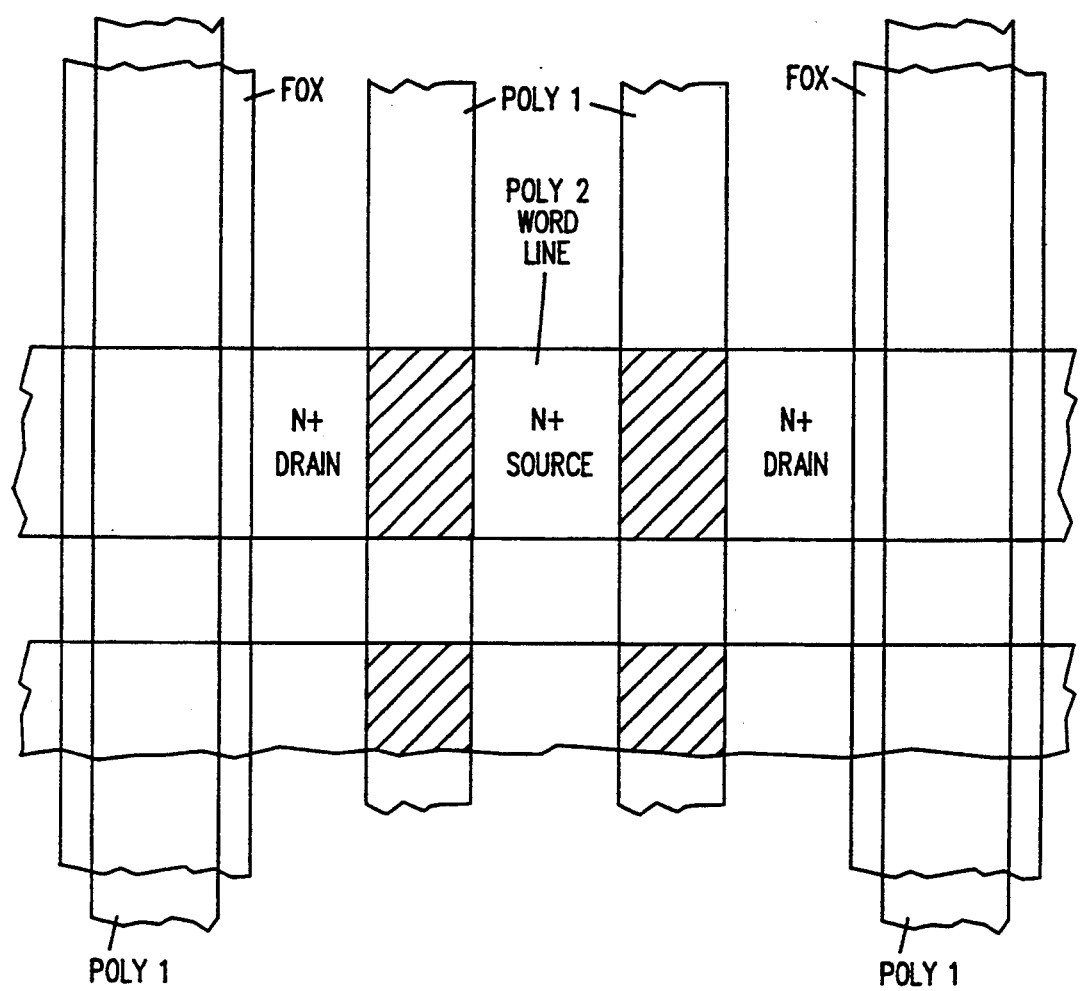
FIG. 9 is a layout illustrating a "field-less" array.

Alternatively, the contactless flash EPROM cell concepts described above may be used to form a so-called "field-less" array, as shown in FIG. 9. A comparison of the FIG. 5 array layout and the FIG. 9 field-less layout will show that the only difference between the two is that, in the FIG. 9 layout, field oxide is not present in the cell area. However, the FIG. 6 schematic representation still applies. That is, the FIG. 9 layout shares a graded N+/N− source region with two adjacent N+bit lines, these three regions being separated on both sides from adjacent similar structures by field oxide. As in the FIG. 5 layout, two poly 1 floating gates run perpendicular to the poly 2 word lines that cross the separating field oxide regions. Also, again as shown in the FIG. 5 array layout, and in accordance with the present invention, the differential oxide step described above is necessary in fabricating the FIG. 9 layout to avoid digging those areas of the N+ lines not protected by either poly 1 or poly 2.

It should be understood that various alternatives to the embodiments in the invention described herein may be employed in practicing the invention. It is intended that the following claims define the scope of the invention and that within the scope of these claims and their equivalents be covered thereby.

What is claimed is:

1. A method of forming a contactless EPROM cell array structure in a silicon substrate of P-type conductivity such that the EPROM cell array structure includes a plurality of shared-source cell segments, the method comprising the steps of:

forming a plurality of parallel, spaced-apart segment field oxide strips in the silicon substrate such that a P-type EPROM cell segment substrate region is defined between adjacent pairs of segment field oxide strips;

forming a layer of first silicon dioxide on the sell segment substrate regions between the segment field oxide strips;

forming a layer of first polysilicon (poly 1) over the layer of first silicon dioxide;

forming a layer of oxide-nitride-oxide (ONO) over the poly 1 layer;

masking the structure formed in the preceding steps and patterning said structure to define between each pair of adjacent segment filed oxide strips, first and second poly 1 lines that run parallel to and spaced-apart from one another and the adjacent segment field oxide stirps and that are separated from the underlying cell segment substrate region by first silicon dioxide and that have ONO formed thereon;

in each cell segment substrate region, simultaneously forming both an N+ shared-source line in said substrate region between the first and second poly 1 lines and first and second N+ drain lines in said substrate region between the first poly 1 line and its adjacent segment field oxide strip and between the second poly 1 line and its adjacent segment field oxide strip, respectively;

performing a differential oxidation step to simultaneously form, in each cell segment substrate region, additional silicon dioxide on the ONO formed on the first and second poly 1 strips and over the N+ shared-source line and the first and second N+ drain lines;

in each cell segment substrate region, forming a plurality of parallel, spaced-apart word lines of second polysilicon (poly 2) overlying and running perpendicular to the first and second poly 1 lines and separated therefrom by the ONO and the additional silicon dioxide; and performing a stacked etch step wherein the poly 2 word lines are utilized as a self-aligned mask do, in each segment substrate region, pattern the first and second poly 1 lines to define a poly 1 floating gate of each EPROM cell in said cell segment substrate region whereby the silicon dioxide over the N+ shared source line and the first and second N+ drain lines in each cell segment substrate region protects said N+ drain lines in each cell segment substrate region protects said N+ lines during the stacked etch step; and whereby EPROM cells are defined at each crossing of a poly 2 word line and an underlying poly 1 floating gate.

2. A method as in claim 1 and further including the step of, prior to the formation of the layer of first polysilicon, in each cell segment substrate region, forming a plurality of spaced-apart array field oxide regions in the silicon substrate, the poly 1 floating gates of each EPROM cell and said cell segments substrate region being defined to extend between a corresponding pair of said array field oxide regions.

3. A method as in claim 1 and including the steps of, in each cell segment substrate region, forming a polysilicon strip on the adjacent pairs of segment field oxide strips defining said cell segment substrate region, the poly 2 word lines in said cell segment substrate region being formed to extend over said polysilicon strips and to be separated therefrom by a layer of dielectric material;

whereby capacitive coupling between the polysilicon strips and the word lines reduces voltage over the segment field oxide strips when the word line is at a high potential.

* * * * *